(12) United States Patent
O'Farrell et al.

(10) Patent No.: US 7,877,875 B2
(45) Date of Patent: Feb. 1, 2011

(54) METHOD FOR CONNECTING A FLEXIBLE PRINTED CIRCUIT BOARD (PCB) TO A PRINTHEAD ASSEMBLY

(75) Inventors: Stephen Richard O'Farrell, Balmain (AU); Jan Waszczuk, Balmain (AU); Stephen John Sleijpen, Balmain (AU); James Andrew, Balmain (AU); Craig Donald Strudwicke, Balmain (AU); William Granger, Balmain (AU); Mark Janos, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 1 day.

(21) Appl. No.: 12/193,735

(22) Filed: Aug. 19, 2008

(65) Prior Publication Data

US 2010/0043220 A1  Feb. 25, 2010

(51) Int. Cl.
  B23P 17/00 (2006.01)
  B21D 53/76 (2006.01)
  H01L 41/00 (2006.01)
  H04R 17/00 (2006.01)
  H05B 3/00 (2006.01)
(52) U.S. Cl. .................. 29/890.1; 29/25.35; 29/611
(58) Field of Classification Search .......... 29/832, 29/611, 25.35, 890.1
  See application file for complete search history.

(56) References Cited

U.S. PATENT DOCUMENTS

| | | | | |
|---|---|---|---|---|
| 3,834,629 A | * | 9/1974 | Hellman et al. | 239/594 |
| 4,543,148 A | * | 9/1985 | Carlson | 156/314 |
| 5,747,102 A | * | 5/1998 | Smith et al. | 427/98.4 |
| 5,846,851 A | * | 12/1998 | Sasaki et al. | 438/118 |
| 6,784,555 B2 | * | 8/2004 | Watson | 257/783 |
| 6,896,205 B2 | * | 5/2005 | Purvis, II et al. | 239/337 |
| 7,055,936 B2 | * | 6/2006 | Imai et al. | 347/58 |
| 7,370,943 B2 | * | 5/2008 | Imai et al. | 347/58 |
| 7,578,576 B2 | | 8/2009 | Inaoka et al. | |
| 2002/0074617 A1 | * | 6/2002 | Shiozawa | 257/522 |
| 2002/0113846 A1 | * | 8/2002 | Wang et al. | 347/68 |
| 2003/0066204 A1 | * | 4/2003 | Dillender | 34/105 |
| 2003/0066863 A1 | * | 4/2003 | Skogsmo et al. | 228/111.5 |
| 2003/0122897 A1 | | 7/2003 | Chou et al. | |

(Continued)

FOREIGN PATENT DOCUMENTS

JP  10-321996 A  12/1998

*Primary Examiner*—A. Dexter Tugbang
*Assistant Examiner*—David P Angwin

(57) ABSTRACT

A method for connecting a flexible printed circuit board (PCB) to a printhead assembly that includes a printhead carrier and an ink ejection printhead carried by the carrier. The method includes the steps of: adhering the PCB to a first surface of the printhead; receiving the printhead and PCB in a mechanical nest, and actuating the nest into a position below a heated platen assembly; heating the heated platen assembly and actuating the heated platen assembly rectilinearly towards the nest, the heated platen assembly thereby compressing the PCB and the printhead; actuating a forming bar assembly, provided adjacent the heated platen assembly, rectilinearly towards the nest, the forming bar assembly thereby bending a portion of the PCB extending beyond the printhead towards the printhead assembly; and heating a heater cartridge and actuating the heater cartridge rectilinearly towards the print head printhead in a direction substantially perpendicular to the direction in which the forming bar assembly is actuated, whereby the PCB is connected to the printhead and bonded to the printhead carrier.

5 Claims, 18 Drawing Sheets

U.S. PATENT DOCUMENTS

| | | | |
|---|---|---|---|
| 2004/0060969 A1* | 4/2004 | Imai et al. | 228/180.21 |
| 2004/0226471 A1 | 11/2004 | Dannoux et al. | |
| 2004/0232202 A1* | 11/2004 | Mosca et al. | 228/1.1 |
| 2006/0203040 A1* | 9/2006 | Imai et al. | 347/58 |
| 2006/0290744 A1* | 12/2006 | Lee et al. | 347/58 |
| 2007/0006805 A1* | 1/2007 | Cruz et al. | 118/300 |
| 2007/0102489 A1* | 5/2007 | Goebl et al. | 228/101 |
| 2007/0206057 A1 | 9/2007 | Brown et al. | |
| 2008/0170102 A1* | 7/2008 | Kim et al. | 347/50 |

* cited by examiner

METHOD FOR CONNECTING A FLEXIBLE PRINTED CIRCUIT BOARD (PCB) TO A PRINTHEAD ASSEMBLY

FIELD OF INVENTION

The present invention generally relates to bonding a flexible printed circuit board (PCB) to integrated circuits, such as that of a printhead.

CO-PENDING APPLICATIONS

The following applications have been filed by the Applicant simultaneously with the present application:

| | | | | | |
|---|---|---|---|---|---|
| 12,193,715 | 12,193,716 | 12,193,717 | 12,193,718 | 12,193,719 | 12,139,720 |
| 12,139,721 | 12,139,722 | 12,139,723 | 12,139,724 | 12,139,725 | 12,139,726 |
| 12,139,727 | 12,139,728 | 12,139,729 | 12,139,730 | 12,139,731 | 12,139,732 |
| 12,139,733 | 12,139,734 | 12,139,736 | 12,139,737 | 12,139,738 | 12,139,739 |
| 12,139,740 | 12,139,741 | 12,139,742 | 12,139,743 | 12,139,745 | 12,139,747 |
| 12,139,748 | 12,139,750 | 12,139,751 | 12,139,753 | | |

The disclosures of these co-pending applications are incorporated herein by reference.

CROSS REFERENCES

The following patents or patent applications filed by the applicant or assignee of the present invention are hereby incorporated by cross-reference.

| | | | | | |
|---|---|---|---|---|---|
| 11/246,687 | 11/246,718 | 7,322,681 | 11/246,686 | 11/246,703 | 11/246,691 |
| 11/246,711 | 11/246,690 | 11/246,712 | 11/246,717 | 7,401,890 | 7,401,910 |
| 11/246,701 | 11/246,702 | 11/246,668 | 11/246,697 | 11/246,698 | 11/246,699 |
| 11/246,675 | 11/246,674 | 11/246,667 | 11/829,957 | 11/829,960 | 11/829,961 |
| 11/829,962 | 11/829,963 | 11/829,966 | 11/829,967 | 11/829,968 | 11/829,969 |
| 11,946,839 | 11,946,838 | 11,946,837 | 11,951,230 | 12,141,034 | 12,140,265 |
| 12,183,003 | 11/688,863 | 11/688,864 | 11/688,865 | 7,364,265 | 11/688,867 |
| 11/688,868 | 11/688,869 | 11/688,871 | 11/688,872 | 11/688,873 | 11/741,766 |
| 12,014,767 | 12,014,768 | 12,014,769 | 12,014,770 | 12,014,771 | 12,014,772 |
| 12,014,773 | 12,014,774 | 12,014,775 | 12,014,776 | 12,014,777 | 12,014,778 |
| 12,014,779 | 12,014,780 | 12,014,781 | 12,014,782 | 12,014,783 | 12,014,784 |
| 12,014,785 | 12,014,787 | 12,014,788 | 12,014,789 | 12,014,790 | 12,014,791 |
| 12,014,792 | 12,014,793 | 12,014,794 | 12,014,796 | 12,014,798 | 12,014,801 |
| 12,014,803 | 12,014,804 | 12,014,805 | 12,014,806 | 12,014,807 | 12,049,371 |
| 12,049,372 | 12,049,373 | 12,049,374 | 12,049,375 | 12,103,674 | 12,146,399 |

BACKGROUND

Pagewidth printers that incorporate micro-electromechanical components generally have printhead integrated circuits that include a silicon substrate with a large number of densely arranged micro-electromechanical nozzle arrangements. Each nozzle arrangement is responsible for ejecting a stream of ink drops.

In order for such printers to print accurately and maintain quality, it is important that the printhead integrated circuits be tested. This is particularly important during the design and development of such integrated circuits.

In order to test such integrated circuits, it is necessary to attach some form of data communication arrangement to the integrated circuits. Flexible printed circuit boards are an example of such a data communication arrangement and have been used to communicate data to integrated circuits.

SUMMARY OF THE INVENTION

According to a first aspect of the present invention, there is provided a bonding device for bonding a flexible printed circuit board (PCB) to a printhead assembly, the printhead assembly having a printhead carrier and an ink ejection printhead carried by the carrier, the bonding device comprising:
  a support structure assembly;
  a first heater assembly arranged on the support structure assembly to be movable along a first path and configured to bond the flexible PCB to the printhead;
  a bending mechanism arranged on the support structure assembly and configured to bend the bonded PCB;
  a second heater assembly movable along a second path and configured to bond the bent PCB to the printhead carrier; and
  a control system to control operation of the heater assemblies and bending mechanism.

The carrier may be formed from liquid crystal polymer (LCP) material.

The first and second paths may be rectilinear and substantially orthogonal. The heater assemblies may be linearly constrained to move along their respective paths.

The bending mechanism may include a bending member movable along a rectilinear path.

The bonding device may further include at least one clamp configured to clamp the flexible PCB to the printhead assembly.

The support structure assembly may include a cabinet. The heater assemblies and bending mechanisms may be located within an internal space of the cabinet. The cabinet may define an access opening to facilitate access to the heater assemblies and bending mechanism within the internal space.

A carriage may be movably mounted within the cabinet and configured to carry the printhead assembly. The carriage may define a nest in which the printhead assembly can be nested.

The control system may include an operator control panel on the cabinet including a plurality of control actuators configured to control the operation of the bending mechanism and the heater assemblies. The control actuators may include a pair of buttons which are configured to operate exclusively on concurrent depression of the buttons. The pair of buttons may be spaced apart so that they cannot be both concurrently pressed using a single hand. The cabinet may further include an operator display panel including a display for displaying information relating to the operation of the bonding device.

The bonding device may further include:
  a light curtain generator configured to generate a light curtain across the access opening; and
  a controller configured to cease the operation of the bonding device responsive to a breach of the light curtain.

The bonding device may further include an authentication system for authenticating the printhead assembly. The authentication system may include an optical scanner configured to scan identification indicia borne by either the printhead or the printhead carrier.

The bonding device may further include a stack of beacons mounted to the cabinet wherein the beacons can be illuminated in a plurality of different ways to represent corresponding operational conditions of the bonding device.

According to a second aspect of the present invention, there is provided a bonding device for bonding a flexible printed circuit board (PCB) to a printhead assembly, the bonding device comprising:

a cabinet defining an internal space and an access opening to facilitate access to the internal space;

at least one movable bonding part located within the internal space and configured to bond the flexible PCB to the printhead assembly;

a light curtain generator configured to generate a light curtain across the access opening; and a controller configured to cease the movement of said movable bonding part responsive to a breach of the light curtain.

The light curtain generator may include:

an elongate light transmitter mounted to the cabinet on one side of the opening and configured to transmit a plurality of beams of light; and an elongate light receiver mounted to the cabinet on another side of the opening and configured to receive said beams of light.

Thus, the controller may further be configured to cease any heating of said movable bonding part responsive to said breach of the light curtain.

The at least one movable bonding part may include:

a first platen assembly movable along a first path and configured to bond the PCB to a printhead of the printhead assembly with adhesive; and a second platen assembly movable along a second path and configured to bond the PCB to a printhead carrier of the printhead assembly with adhesive.

The at least one movable bonding part may further include a bending mechanism configured to bend the PCB between bonding the PCB to the printhead and the printhead carrier.

The first and second paths may be rectilinear and substantially orthogonal to each other.

The cabinet may include an operator control panel including a plurality of control actuators configured to control operation of the bonding device.

The cabinet may have an operator display panel including a display for displaying information relating to the operation of the bonding device, the display being a touch screen display operatively connected to the controller to enable an operator to make selections relating to the operation of the bonding device.

According to a third aspect of the present invention, there is provided an attachment apparatus for attaching a flexible printed circuit board (PCB) to a printhead assembly, the attachment apparatus comprising:

a housing assembly having a control panel with a plurality of operational control actuators;

at least one attachment assembly movably mounted within the cabinet and configured to bond the flexible PCB to the printhead assembly; and a control system configured to control said attachment assembly to bond the PCB to the printhead assembly responsive to a pair of said control actuators being concurrently actuated, the pair being spaced apart to ensure two-handed operation.

The plurality of operational control actuators may further include:

an emergency stop actuator configured to cause the control system to cease any movement of said at least one attachment assembly; and a reset actuator configured to cause the control system to reset operation of the attachment assembly subsequent to the actuation of the emergency stop actuator.

The at least one attachment assembly may include:

a first attachment assembly movable along a first path and configured to bond the PCB to a printhead of the printhead assembly with adhesive; and a second attachment assembly movable along a second path and configured to bond the PCB to a printhead carrier of the printhead assembly with adhesive.

The attachment assembly may include at least one clamp configured to clamp the flexible PCB to the printhead assembly.

The attachment assembly may further include a light curtain generator configured to generate a light curtain across an access opening defined by the housing assembly. The control system may be configured to cease operation of said attachment assemblies responsive to a breach of the light curtain.

The housing assembly may further include a light emitting indicator configured to be illuminated in a plurality of different ways to represent corresponding operational conditions of the attachment apparatus.

According to a fourth aspect of the present invention, there is provided a method for connecting a flexible printed circuit board (PCB) to a printhead assembly, the printhead assembly comprising a printhead carrier and an ink ejection printhead carried by the carrier, the method comprising the steps of:

connecting the flexible PCB to the printhead using a first connector movable along a first path;

bending the bonded PCB; and connecting the bent PCB to the printhead carrier using a second connector movable along a second path.

The flexible PCB may be clamped to the printhead assembly.

The printhead assembly may be authenticated by scanning a barcode borne by the printhead assembly. The PCB may also be authenticated scanning a barcode borne by the PCB.

The step of connecting the flexible PCB to the printhead may involve mechanically connecting the PCB to the printhead with adhesive.

The step of connecting the bent PCB to the printhead carrier may involve mechanically connecting the PCB to the printhead carrier with an adhesive.

The connectors may be linearly constrained to move along the first and second paths, which are rectilinear and substantially orthogonal to each other.

According to a fifth aspect of the present invention, there is provided a fastening apparatus for fastening a flexible printed circuit board (PCB) to a printhead assembly, the printhead assembly having a printhead carrier and an ink ejection printhead carried by the carrier, the fastening apparatus comprising:

a support assembly;

an authentication system arranged on the support assembly and configured to authenticate the printhead assembly;

at least one bonding assembly arranged on the support assembly and configured to bond the PCB to the printhead assembly; and a controller operatively connected to the authentication system and the bonding assembly and configured to control the heater assembly to bond the PCB to the printhead assembly subsequent to the authentication of the printhead assembly.

The authentication system may include an optical scanner configured to scan identification indicia borne by either the printhead or the printhead carrier. The identification indicia may be a barcode.

The authentication system may be configured to further authenticate the PCB, and the controller may be configured to control the bonding assembly to bond the PCB to the printhead assembly subsequent to the further authentication of the PCB.

The bonding assembly may further include a bending mechanism configured to bend the PCB subsequent to bonding the PCB to the printhead of the printhead assembly.

The support assembly may include a visible indicator operatively connected to the controller, which may be configured to control the visible indicator in a plurality of different ways to represent corresponding operational conditions of the fastening apparatus.

According to a sixth aspect of the present invention, there is provided a bonding device for bonding a flexible printed circuit board (PCB) to an ink ejection printhead, the bonding device comprising:

an authentication system for authenticating the printhead;
a movable heater assembly configured to bond the PCB to the printhead; and
a controller configured to control the heater assembly to bond the PCB to the printhead subsequent to the authentication of the printhead.

BRIEF DESCRIPTION OF THE DRAWINGS

Preferred features, embodiments and variations of the invention may be discerned from the following Detailed Description which provides sufficient information for those skilled in the art to perform the invention. The Detailed Description is not to be regarded as limiting the scope of the preceding Summary of the Invention in any way. The Detailed Description will make reference to a number of drawings as follows.

DETAILED DESCRIPTION OF PREFERRED EMBODIMENTS

Figure 1:
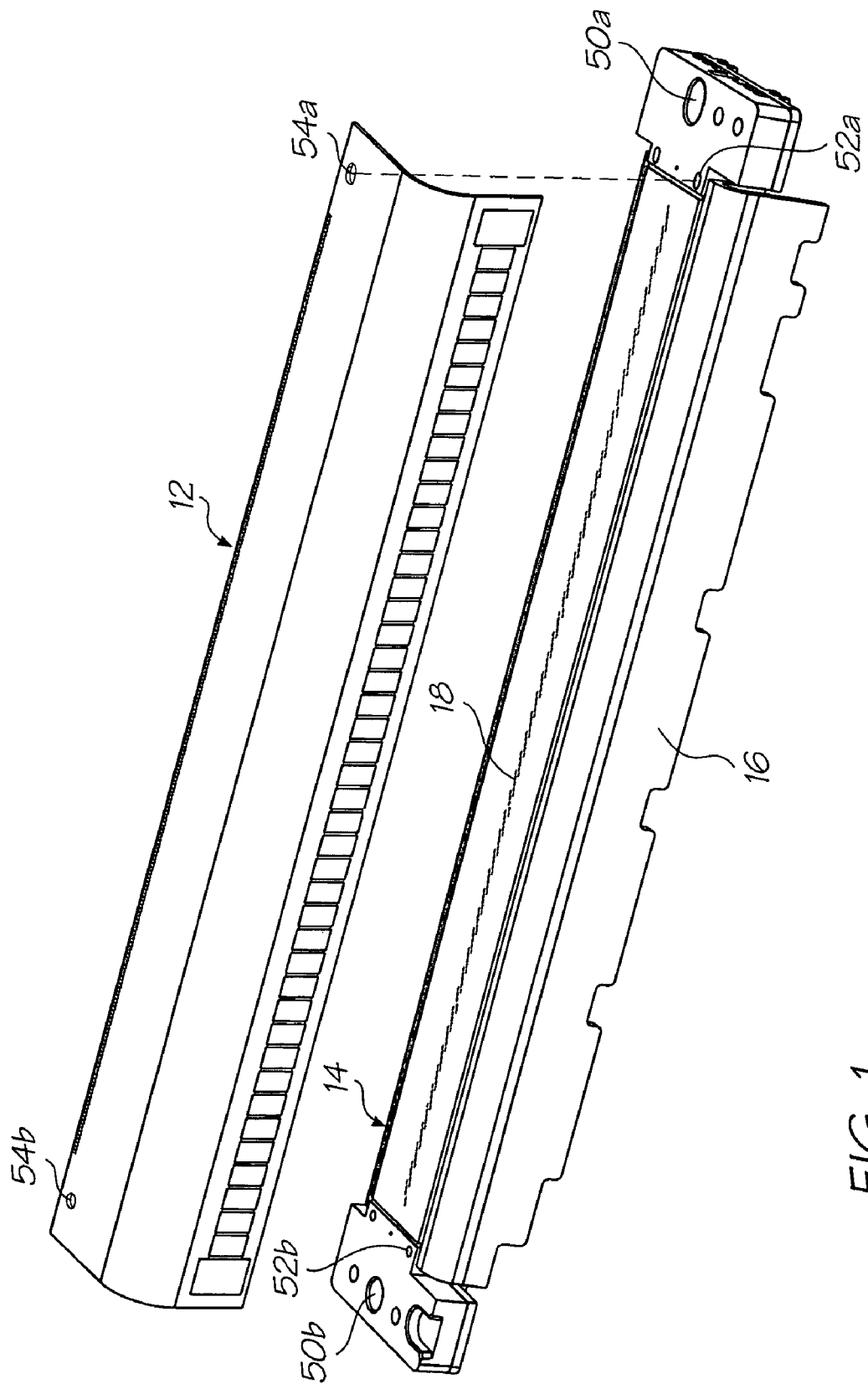
FIG. 1 is a perspective view of a flexible printed circuit board (PCB) and a printhead assembly to be bonded, fastened or connected together according to a method of the invention with an apparatus of the invention.
Figure 2:
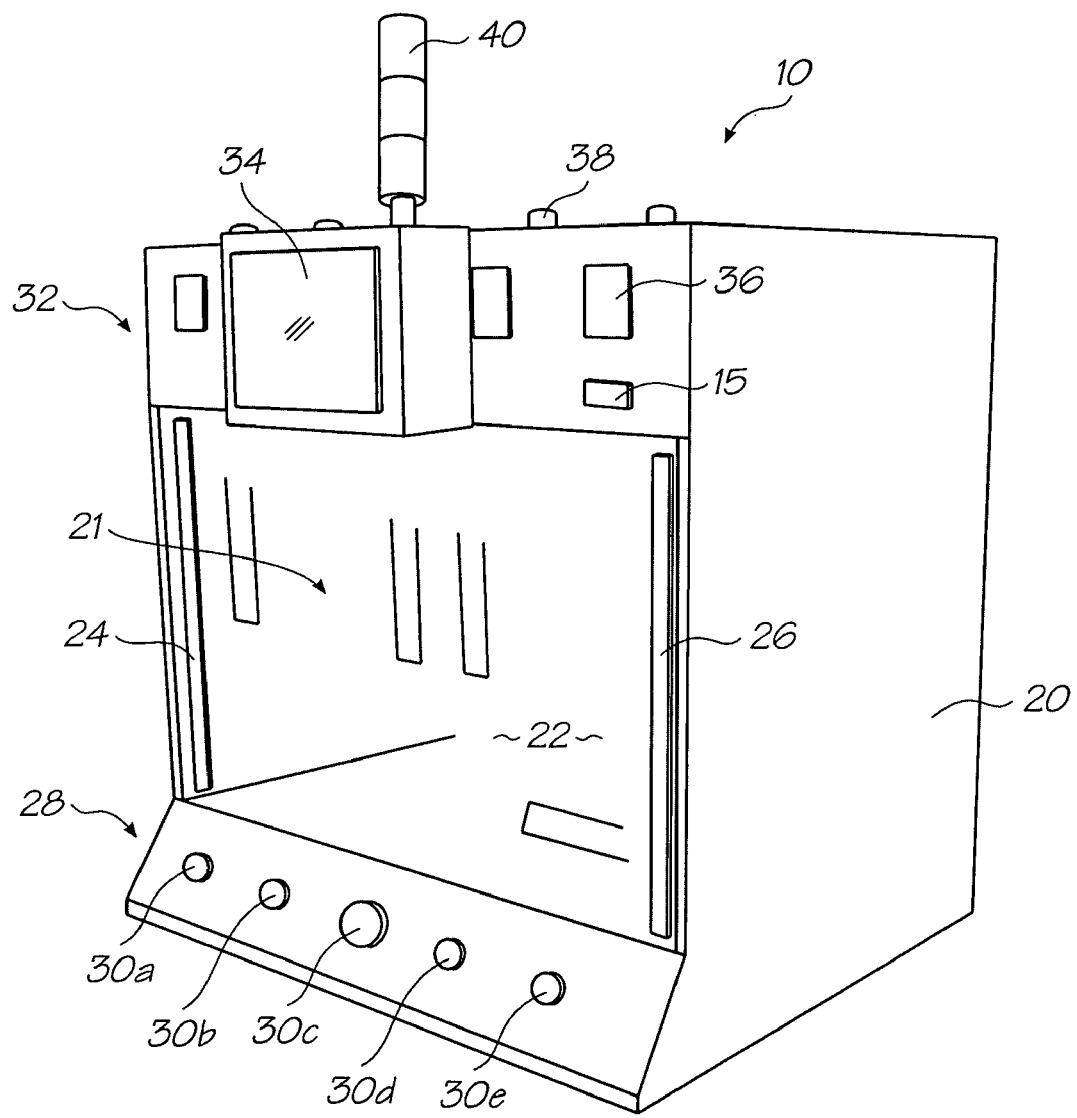
FIG. 2 is a perspective view of a bonding device for bonding together the flexible PCB and printhead assembly shown in FIG. 1, according to one embodiment of the present invention.

According to an embodiment of the present invention, there is provided a bonding, attachment or fastening device or apparatus 10 shown in FIG. 2 which is configured to bond a flexible printed circuit board (PCB) 12 to a printhead assembly 14 as shown in FIG. 1. The printhead assembly 14 has a carrier 16. A lamination film is arranged on the carrier 16. An ink ejection printhead 18 is carried on the film.

The film defines a plurality of openings (not shown) which correspond with openings in the printhead 18 and in part of the carrier 16 so that the printhead 18 can be fed with fluid for testing purposes.

The underside of the PCB 12 is coated with an adhesive and the carrier 16 is formed from liquid crystal polymer (LCP) material which is inherently resistant to heat deformation. In use, one or more bonding assemblies, fasteners or connectors or platen assemblies of the bonding device 10 mechanically bond the flexible PCB 12 to the printhead assembly 14 with the adhesive. A detailed description of the bonding device 10 is provided below.

Turning to FIG. 2, the bonding device 10 has a housing or support structure assembly that includes a cabinet 20. The cabinet 20 defines an internal space 22 and a front access opening to facilitate operator access to movable bonding parts 21 located in the internal space 22. A light curtain generator is configured to generate a light curtain across the front access opening. The light curtain generator includes an elongate light transmitter 24 mounted to the cabinet on one side of the opening and an elongate light receiver 26 mounted to the cabinet 20 on the other side of the opening. In use, the transmitter 24 transmits a plurality of beams of light which are received by the receiver 26, thereby forming the light curtain.

The bonding device 10 further includes a control system or controller which is configured to cease the operation of the movable bonding parts 21, including the bonding or heater assemblies, responsive to a breach of the light curtain. That is, any movement and heating of the parts 21 is immediately ceased in the event that the operator reaches a hand into the internal space 22, thereby reducing the possibility of injury to the operator.

The cabinet 20 includes an operator control panel 28 located at its base. The control panel 28 includes a row of control press-buttons 30 (i.e. actuators) configured to control the operation of the bonding device 10. The outer press buttons 30a, 30e are START buttons which must be concurrently pressed before the PCB 12 can be bonded to the printhead assembly 14. The controller is configured to control the heater assemblies to bond the PCB 12 to the printhead assembly 14 responsive to the buttons 30a, 30e being concurrently pressed. The START buttons 30a, 30e are spaced apart so that the operator cannot concurrently press both of them using a single hand. In this manner, the operator must have both hands located external to the cabinet 20 when initiating operation of the bonding device 10, thereby ensuring that one hand cannot be located within the cabinet 20.

The bonding device 10 further includes an authentication system for authenticating the printhead assembly 14. The authentication system includes an optical barcode scanner 15 configured to scan barcodes borne by either the printhead 18 or the printhead carrier 16. The scanner 15 is fastened to the cabinet 20, either in the space 22 or on a front panel, and reading of the barcodes is initiated when the operator presses a SCAN press button 30b of the operator control panel 28. The controller is configured to control the heater assemblies to bond the PCB 12 to the printhead assembly 14, only subsequent to the authentication of the printhead assembly 14.

The operator control panel 28 further includes an EMERGENCY STOP button 30c which can be pressed by the operator to cease operation of the bonding device 10 at any time and, in particular, in the event of an emergency. Pressing the EMERGENCY STOP button 30c causes the controller to cease any movement and heating of the heater assemblies. Once the emergency has been addressed, a RESET button 30d of the operator control panel 28 can be pressed to cause the controller to reset the operation of the bonding device 10.

The cabinet 20 also has an upper operator display panel 32. The display panel 32 includes a "touch screen" liquid crystal display (LCD) 34 displaying information relating to the operation of the bonding device 10. The operator can modify operating parameters of the bonding device 10 with a finger, by selecting various options displayed on the LCD 34. The operator display panel 32 further includes a quartet of binary coded decimal (BCD) displays 36 for each displaying the set clamping pressure of a respective clamp or heater assembly of the bonding device 10. A quartet of adjustment knobs 38 are provided on the roof of the cabinet 20 in register with respective BCD displays 36. The set clamping pressure of the internal clamps and heater assemblies can be adjusted by adjusting corresponding adjustment knobs 38.

The bonding device 10 further includes a visible indicator in the form of a light emitting indicator such as a stack of three beacons 40 mounted to the roof of the cabinet 20. The uppermost beacon includes a green light, the intermediate beacon includes an amber light and the bottommost beacon includes a red light. The beacons can be illuminated in a plurality of different ways to represent corresponding operational conditions of the bonding device, the operational conditions including: an occurrence of an operational error with the bonding device 10; a warm up period when the heater assemblies are being warmed up to a threshold operational temperature; a standby mode where the bonding device 10 is ready to initiate operation; and an operational mode where the bonding device 10 is operating.

Figure 3:
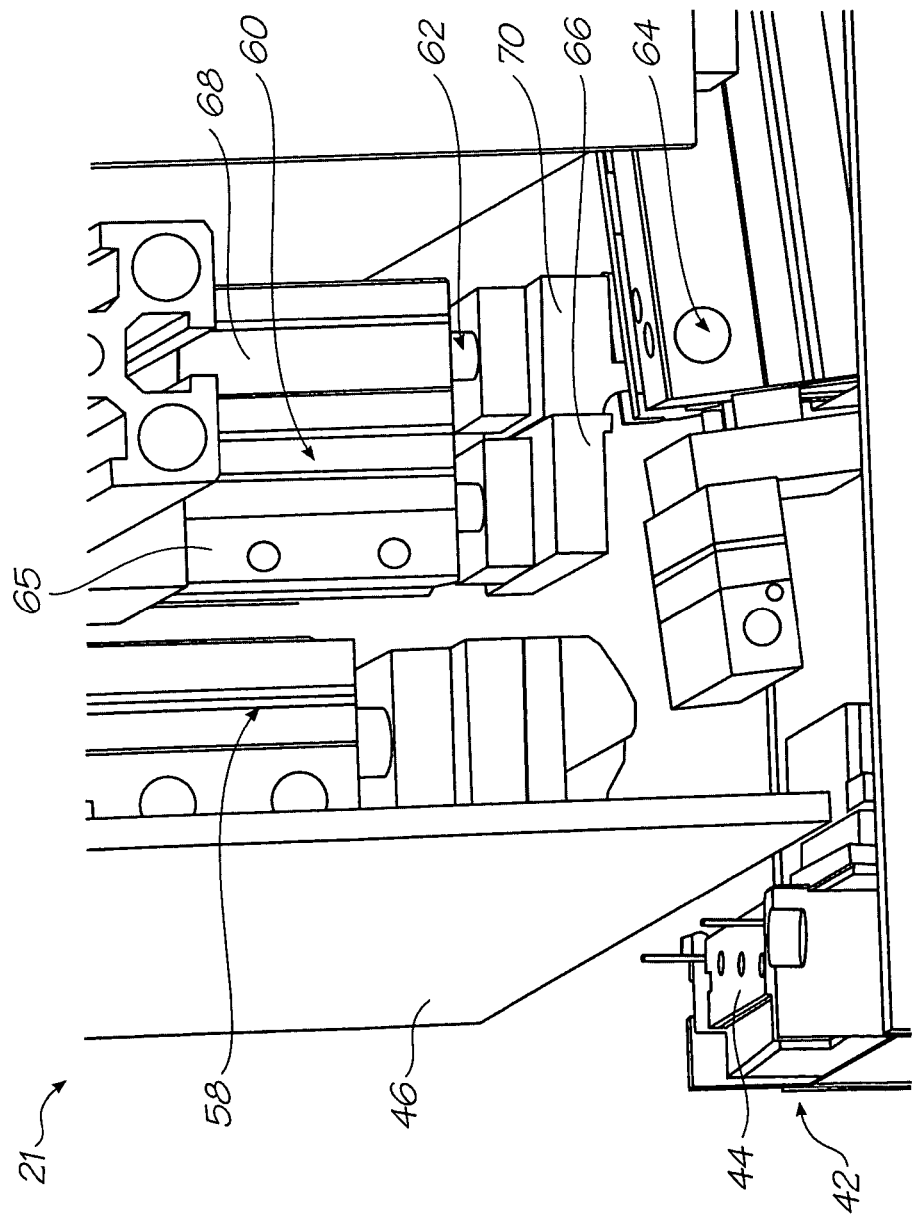
FIG. 3 is a perspective view showing the internal bonding parts of the bonding device of FIG. 2.

FIG. 3 shows the movable bonding parts 21 of the bonding device 10 which are located within the internal space 22 of the cabinet 20. The movable bonding parts 21 include pneumatic actuators which are selectively actuated responsive to control signals from the bonding device controller. A detailed description of the bonding parts 21 is provided below.

The movable bonding parts 21 include a pneumatic carriage 42 which is movably mounted within the cabinet 20 and is configured to carry the printhead assembly 14. The carriage 42 defines a raised nest 44 in which the printhead assembly 14 can be nested. In use, the nest 44 carrying the printhead assembly 14 and PCB 12 can be rectilinearly moved from outside the cabinet 20, to within the space 22 of the cabinet 20 via the front opening (before the light curtain 46 is generated) so that various bonding parts 21 can perform suitable operations to fasten the printhead assembly 14 and PCB 12 together.

Figure 4:
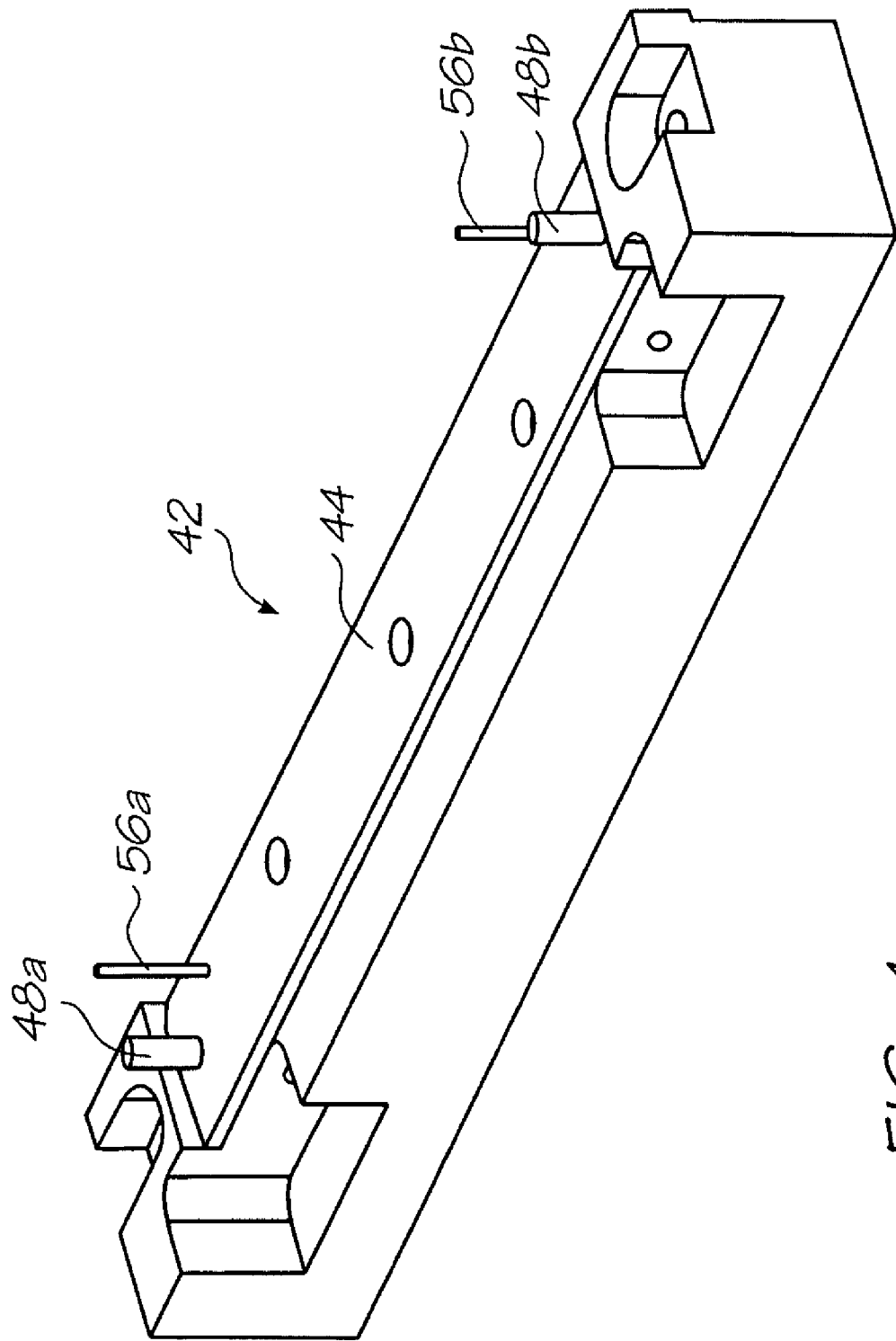
FIG. 4 is a perspective view of a carriage of the bonding device of FIG. 2 which is configured to carry a carrier on which the printhead assembly is supported for testing purposes.

FIG. 4 shows the carriage 42 and the nest 44 in detail. The nest 44 defines an upwardly facing recess in which the printhead assembly 14 can be rested. A pair of locating pegs 48a, b extend upwardly from the base of the nest 44 and are spaced apart to correspond to complementary guide holes 50a, b defined in the printhead assembly 14 (see FIG. 1). In use, the operator places the printhead assembly 14 in the nest 44 so that the locating pegs 48a, b extend through the guide holes 50a, b.

Furthermore, a pair of locating pins 56a,b extend upwardly from the base of the nest 44 and are spaced apart to correspond to: complementary guide holes 52a,b defined in the printhead assembly 14; and complementary guide holes 54a,b defined in the PCB 12 (see FIG. 1). In use, the operator places the printhead assembly 14 in the nest 44 so that the locating pins 56a, b extend through the guide holes 52a, b. In turn, the operator places the PCB 12 on the printhead assembly 14, with the adhesive on its underside, so that the locating pins 56a, b extend through the guide holes 54a, b. The bonding device 10 can then bond the PCB 12 and printhead assembly 14 together.

Returning to FIG. 3, the movable bonding parts 21 further include a pneumatically driven vertical heated platen assembly 58, a vertical clamping assembly 60, a vertical forming bar assembly 62 and a horizontal heated platen assembly 64.

The vertical clamping assembly 60 and forming bar assembly 62 are of like construction. The vertical clamping assembly 60 includes a pneumatic actuator 65 which is fixed within the cabinet 20, and a movable clamp 66 which is constrained to reciprocate rectilinearly upon actuation of the actuator 65. Similarly, the forming bar assembly 62 includes a pneumatic actuator 68 which is fixed within the cabinet 20, and a movable bar 70 (or member) which is constrained to reciprocate rectilinearly upon actuation of the actuator 68. In use, the forming bar assembly 62 forms a bending mechanism for bending the flexible PCB 12.

Figure 5:
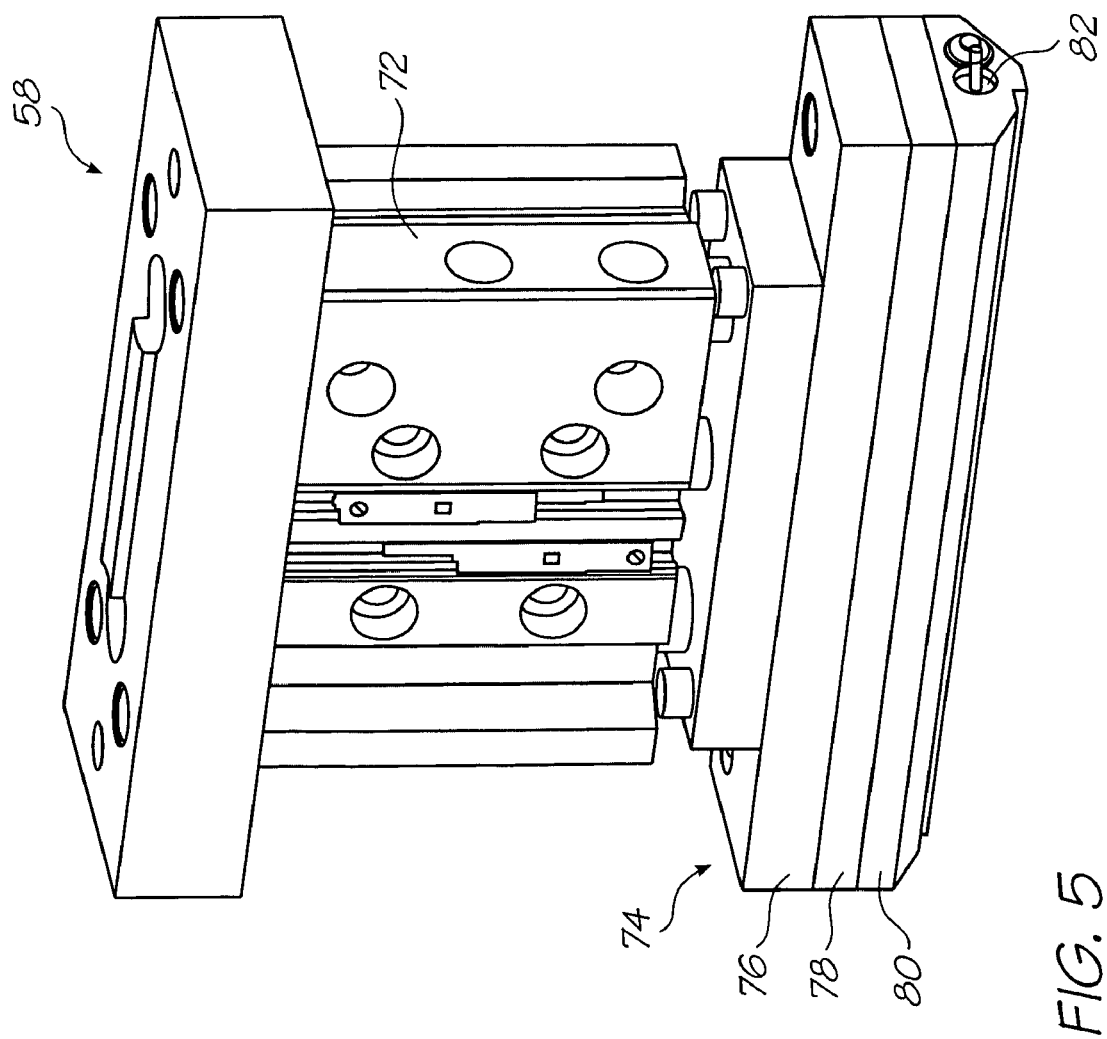
FIG. 5 is a perspective view of a vertical heated platen assembly of the bonding device of FIG. 2.

FIG. 5 shows the vertical heated platen assembly 58 in detail. The heated platen assembly 58 includes a pneumatic actuator 72 fixed within the cabinet 20, and a heater assembly 74 which is constrained to reciprocate rectilinearly upon actuation of the actuator 72. The heater assembly 74 can move along a vertical path to bond the flexible PCB 12 to the printhead 18 with adhesive on the underside of the PCB 12.

The heater assembly 74 includes a steel platen 76, a thermal insulation sheet 78 mounted to the steel platen 76, and a thermally conductive brass platen 80 mounted to the insulation sheet 78. The brass platen 80 tapers to an apex at its base for engagement with the PCB 12. The brass platen defines an internal chamber in which a replaceable heater cartridge 82 is located.

Figure 6:
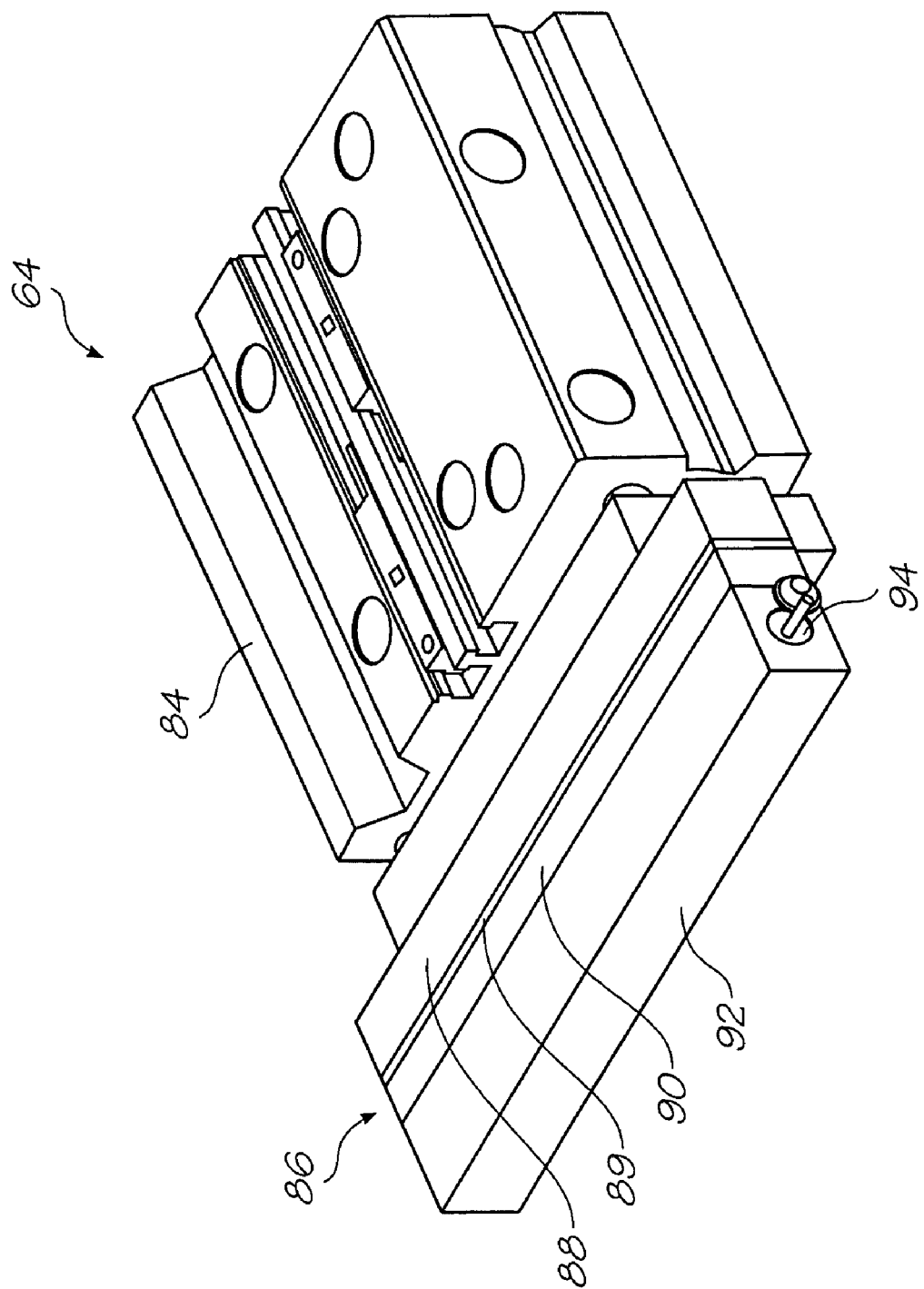
FIG. 6 is a perspective view of a horizontal heated platen assembly of the bonding device of FIG. 2.

FIG. 6 shows the horizontal heated platen assembly 64 in detail. The heated platen assembly 64 includes a pneumatic actuator 84 fixed within the cabinet 20, and a heater assembly 86 which is constrained to reciprocate rectilinearly upon actuation of the actuator 84. The heater assembly 86 can move along a substantially horizontal path to mechanically bond the flexible PCB 12 to the printhead carrier 16 with adhesive on the underside of the PCB 12.

The heater assembly 86 includes a steel platen 88, a silicone sheet 89 mounted to the steel platen 88, a thermal insulation sheet 90 mounted to the silicone sheet 89, and a thermally conductive brass platen 92 mounted to the insulation sheet 90. The brass platen 92 defines a substantially flat engagement surface. The brass platen 92 further defines an internal chamber in which a replaceable heater cartridge 94 is located.

Figure 7:
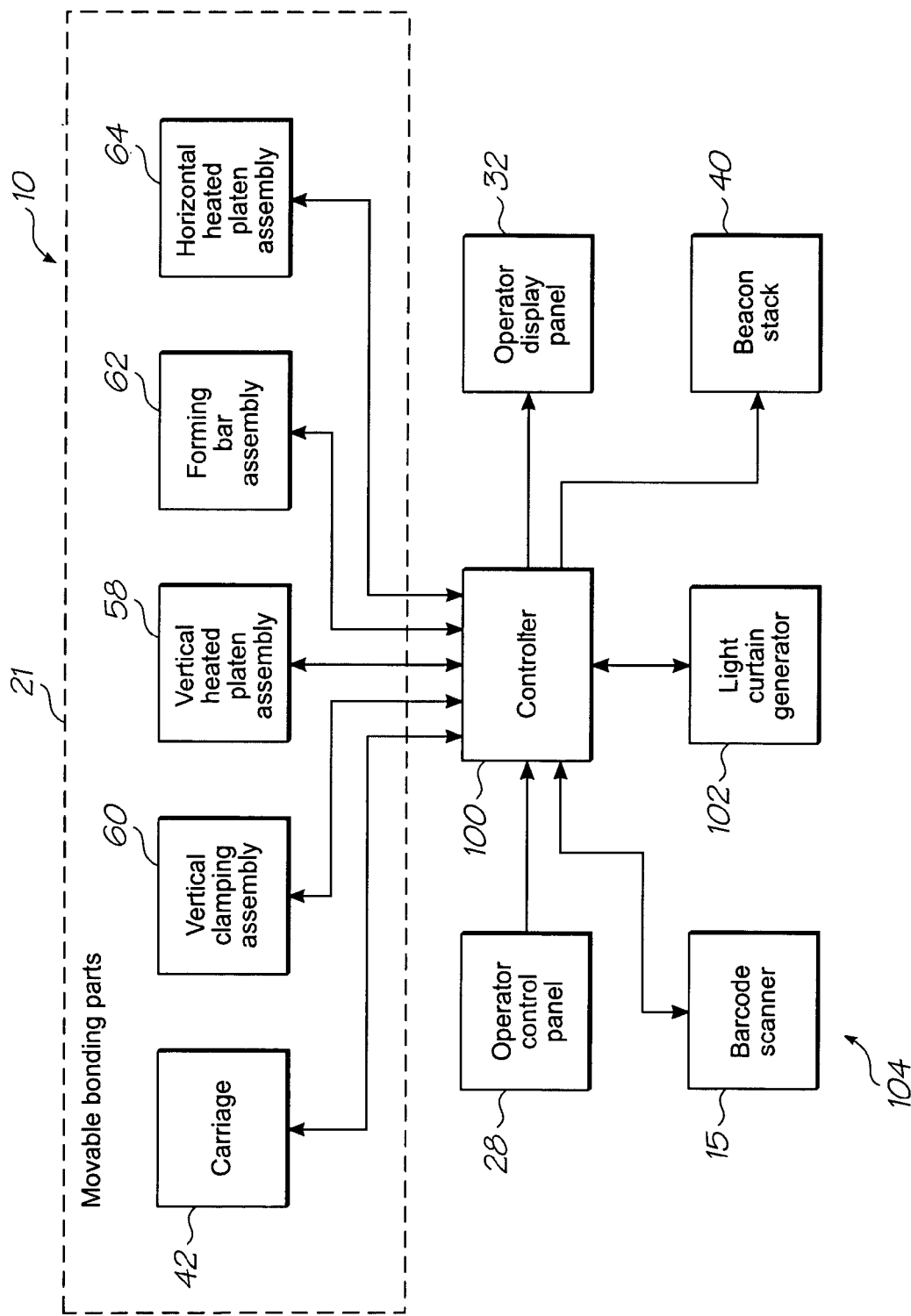
FIG. 7 is a functional block diagram of the bonding device of FIG. 2.

FIG. 7 shows a block diagram of the bonding device 10. The bonding device 10 includes a central control system or controller 100 for controlling the operations of the bonding device 10. The controller 100 includes one or more processors and electronic interface circuitry for interfacing with the peripheral components.

The controller 100 controls the operation of the pneumatic movable bonding parts 21, as described in detail below, and receives feedback from each of those parts. The controller 100 further receives inputs from the operator control panel 28 as previously described, and displays information using the operator display panel 32 and the beacon stack 40. The controller 100 further controls a light curtain generator 102 to generate the light curtain 46 (FIG. 3), and is configured to cease any movement of the movable bonding parts 21 responsive to a breach of the light curtain 46 as previously described. The controller 100 further controls the barcode scanner 15 of an authentication system 104 to authenticate the printhead assembly 14 as previously described.

Software is typically provided on a media, such as a magnetic or optical disk or solid state memory, which contains computer readable instructions for execution by the controller 100 to thereby perform the automated steps of the proceeding method 110.

A method 110 for bonding the flexible PCB 12 to the printhead assembly 14 is now described in detail below with reference to FIG. 8. The method 110 includes manual setup steps which the operator can perform in parallel and automated bonding steps which can be sequentially performed by the bonding device 10.

At step 112, the operator removes the printhead assembly 14 from a clean storage facility.

At step 114, the operator holds a printhead barcode borne by the printhead assembly 14 in register with the barcode scanner 15 of the authentication system 104. The operator then presses the SCAN press button 30b of the operator control panel 28 to scan the printhead barcode. The controller 100 compares the identity of the scanned printhead barcode with a list of valid printhead barcodes stored in memory and authenticates the printhead assembly 14 upon detecting a match.

At step 116, the operator loads the authenticated printhead assembly 14 into the nest 44 of the carriage 42. The carriage 42 is located external to the internal space 22 of the cabinet 20 as shown in FIG. 3. As previously described, the locating pegs 48a,b and locating pins 56a,b extending from the nest 44 (FIG. 4) are inserted into respective guide holes 50a,b and guide holes 52a,b defined in the printhead assembly 14 (FIG. 1).

At step 118, the operator manually removes the flexible PCB 12 from an anti-static storage cabinet.

At step 120, the operator holds a PCB barcode borne by the PCB 12 in register with the barcode scanner 15 of the authentication system 104. The operator then presses the SCAN press button 30b of the operator control panel 28 to scan the PCB barcode. The controller 100 compares the identity of the scanned PCB barcode with a list of valid PCB barcodes stored in memory and authenticates the PCB 12 upon detecting a match.

At step 122, the operator peels a protective backing strip from the authentic PCB 12 to reveal an exposed adhesive on the underside of the PCB 12.

At step 124, the operator loads the authentic PCB 12 onto the carriage 42 with the adhesive facing downwards toward the previously loaded printhead assembly 14. As previously described, the locating pins 56a, b extending from the nest 44 (FIG. 4) are inserted into respective guide holes 54a, b defined in the PCB 12 (FIG. 1).

Figure 9A:
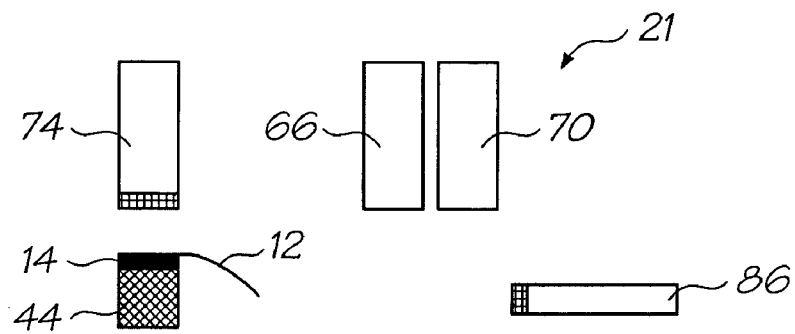
FIGS. 9A-J are schematic side views showing the relative positions of the internal bonding parts of FIG. 3 when bonding the flexible PCB to the printhead assembly.

At step 126, the operator initiates bonding of the PCB 12 to the printhead assembly 14 with the bonding device 10. The operator concurrently presses the START buttons 30a, 30e with respective hands and the controller 100 moves the nest into the internal space 22 of the cabinet 20 as shown in FIG. 9A. Subsequently, the controller 100 controls the light curtain generator 102 to generate the light curtain 46 across the front opening of the cabinet 20 (FIG. 3).

Figure 9B:
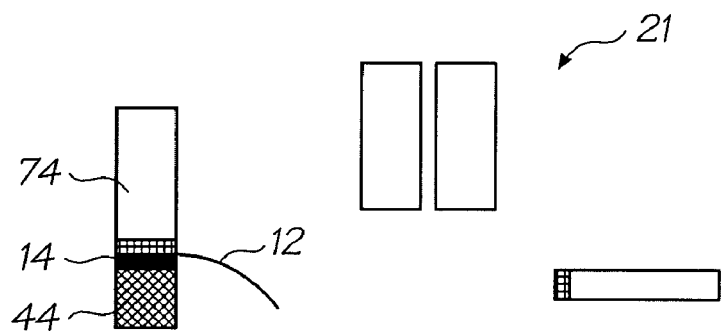
Figure 9C:
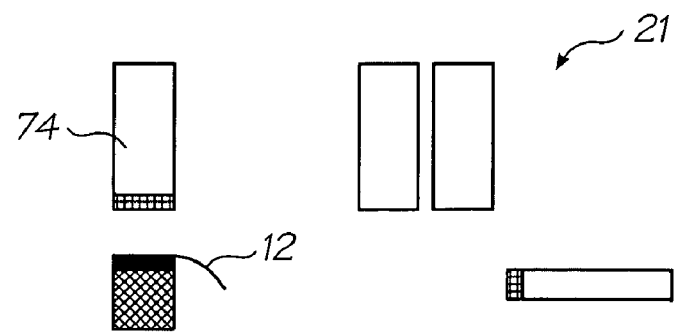

The controller 100 controls the heater cartridge 82 at the tip of the vertical heater assembly 74 to be heated. As shown in FIG. 9B, the controller 100 actuates the pneumatic actuator 72 of the vertical heated platen assembly 58 so that the heater assembly 74 and nest 44 compress the printhead assembly 14 and PCB 12. The heater cartridge 82 is heated for a predetermined period to ensure that the PCB 12 is bonded to a substrate of the printhead 18 with the adhesive. As shown in FIG. 9C, the controller 100 then actuates the pneumatic actuator 72 of the vertical heated platen assembly 58 so that the heater assembly 74 is withdrawn from the PCB 12.

Figure 8:
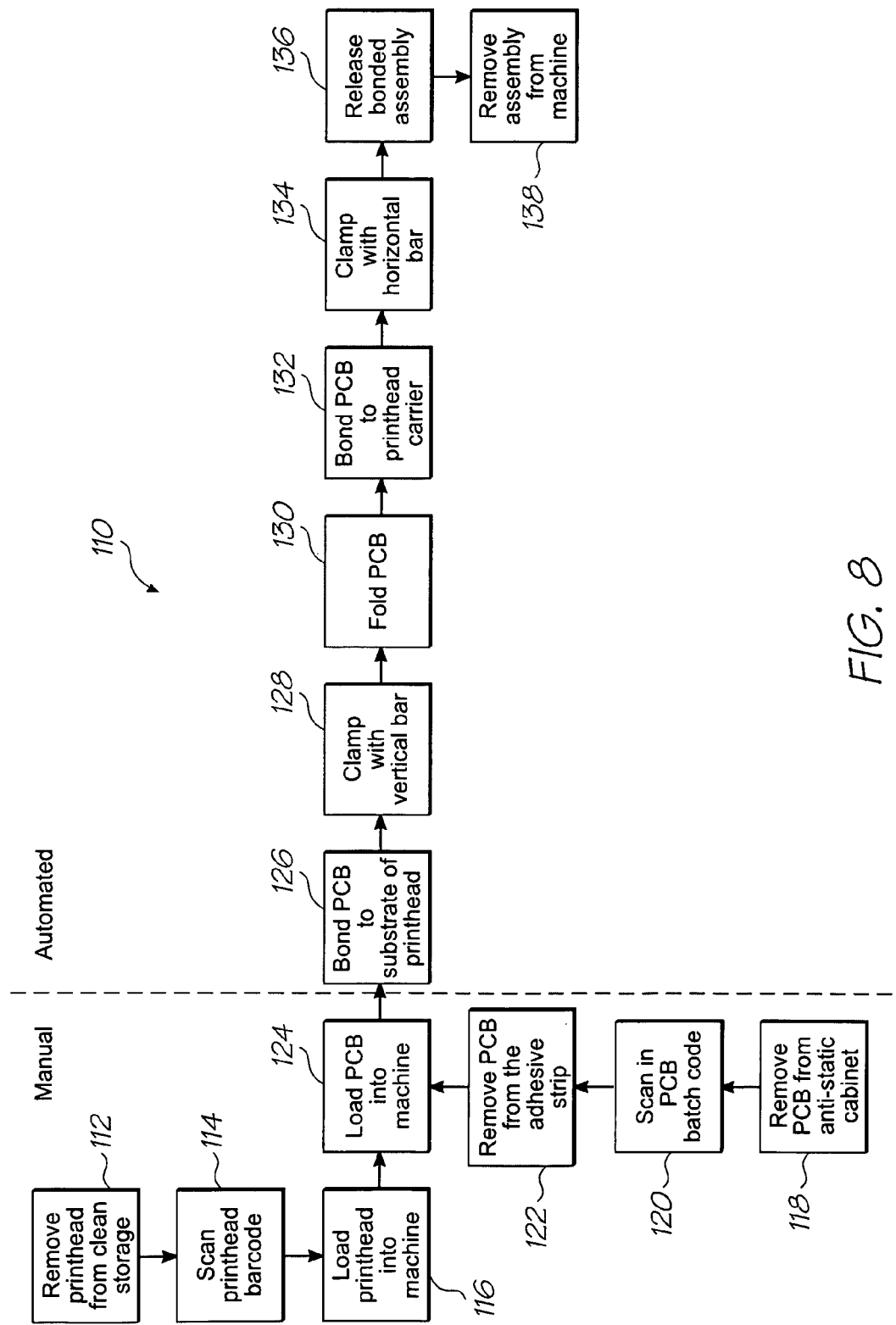
FIG. 8 is a flowchart showing the steps involved with bonding together the flexible PCB and printhead assembly using the bonding device of FIG. 2.
Figure 9D:
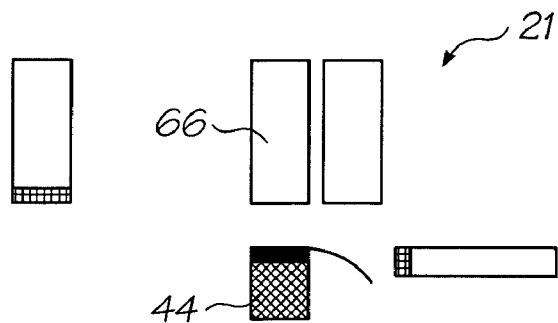
Figure 9E:
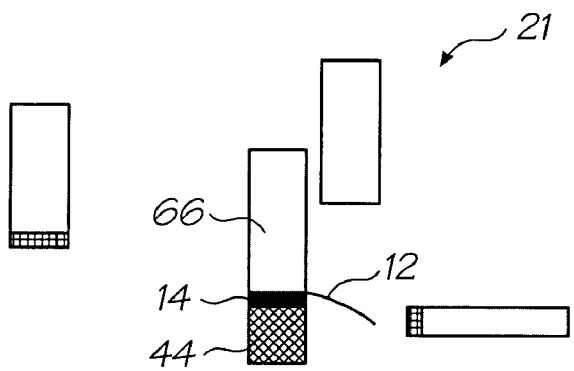

At step 128 of FIG. 8, the controller 100 controls the carriage 42 to move the nest 44 in register with the movable clamp 66 of the vertical clamping assembly 60 as shown in FIG. 9D. The controller 100 actuates the pneumatic actuator 65 of the vertical clamping assembly 60 so that the printhead assembly 14 and PCB 12 are compressed between the nest 44 and clamp 66 as shown in FIG. 9E.

Figure 9F:
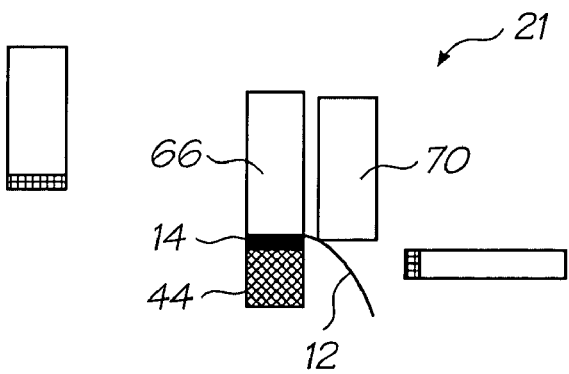

At step 130 of FIG. 8, the controller 100 actuates the pneumatic actuator 68 of the forming bar assembly 62 so that the movable bar 70 moves vertically downward and folds (or bends) the PCB 12 downwardly as shown in FIG. 9F.

Figure 9G:
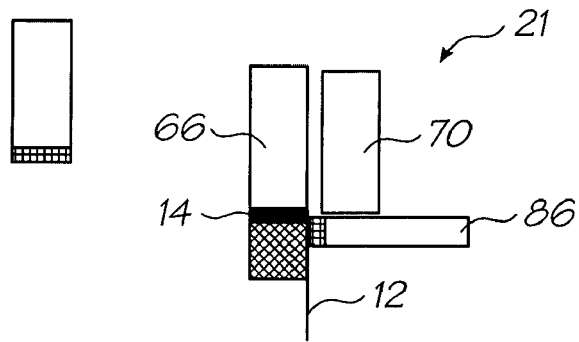
Figure 9H:
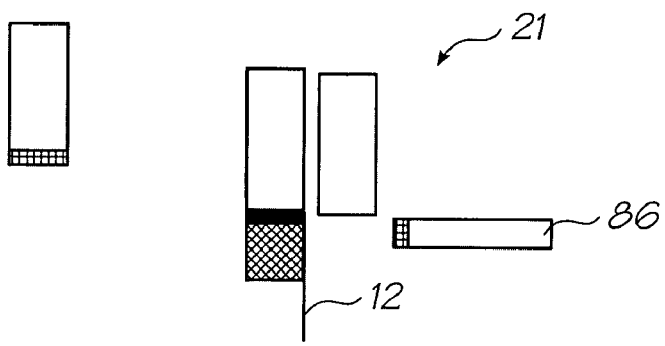

At step 132 of FIG. 8, the controller 100 controls the heater cartridge 94 at the tip of the horizontal heater assembly 86 to be heated. As shown in FIG. 9G, the controller 100 actuates the pneumatic actuator 84 of the horizontal heated platen assembly 64 so that the heater assembly 86 presses the bent PCB 12 against the printhead carrier 16 of the printhead assembly 14. The heater cartridge 94 is heated for a predetermined period to ensure that the PCB 12 is firmly bonded to the printhead carrier 16 with the adhesive. As shown in FIG. 9H, the controller 100 then actuates the pneumatic actuator 84 of the horizontal heated platen assembly 64 so that the heater assembly 86 is withdrawn from the PCB 12.

At step 134 of FIG. 8, a horizontal clamp in the form of the brass platen 92 clamps against the PCB 12 to compress the bonded PCB 12 between the printhead carrier 16 and brass platen 92 until the adhesive is set.

Figure 9I:
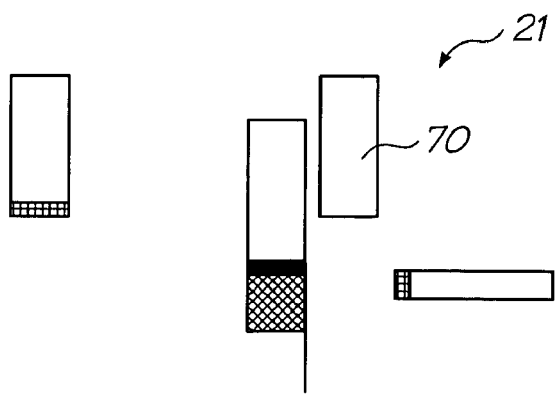
Figure 9J:
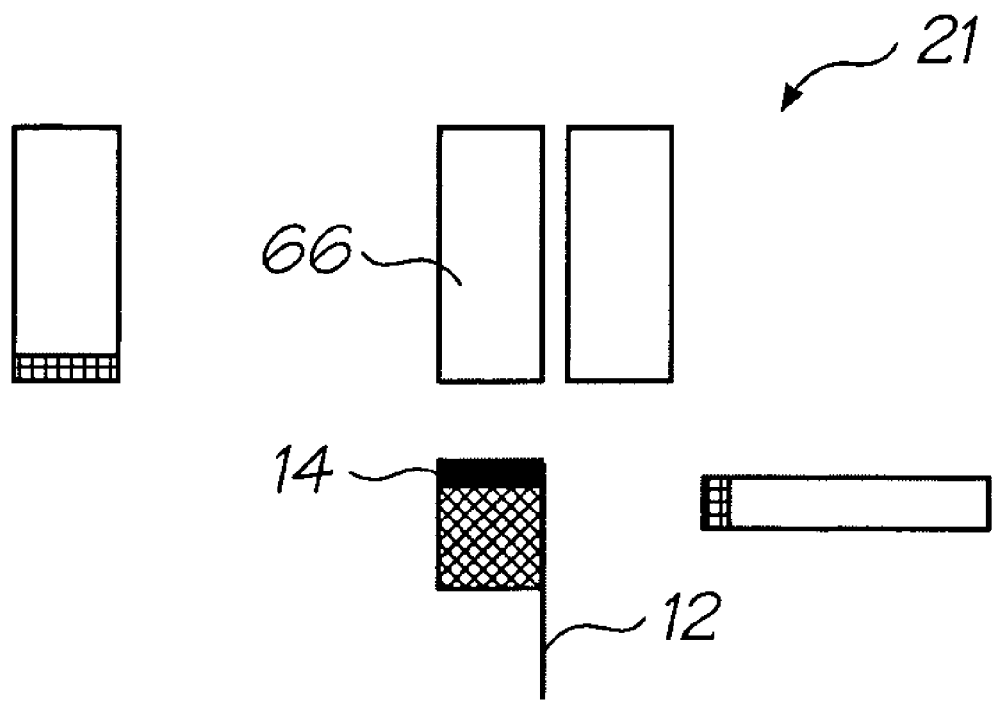

At step 136 of FIG. 8, the controller 100 actuates the pneumatic actuator 68 of the forming bar assembly 62 so that the movable bar 70 moves vertically upwards as shown in FIG. 9I. Subsequently, the controller 100 actuates the pneumatic actuator 65 of the vertical clamping assembly 60 so that the clamp 66 moves vertically upwards as shown in FIG. 9J and thereby releases the bonded assembly from compression.

At step 138 of FIG. 8, the controller 100 controls the light curtain generator 102 to disarm the light curtain 46 and moves the nest 44 out from the internal space 22 of the cabinet 20 to the position shown in FIG. 3. The controller 100 controls the beacon stack 40 to signal that the bonding process is complete and the operator can then freely remove the bonded assembly from the nest 44. A manual visual inspection of the bonded assembly can then be performed by the operator.

Figure 10:
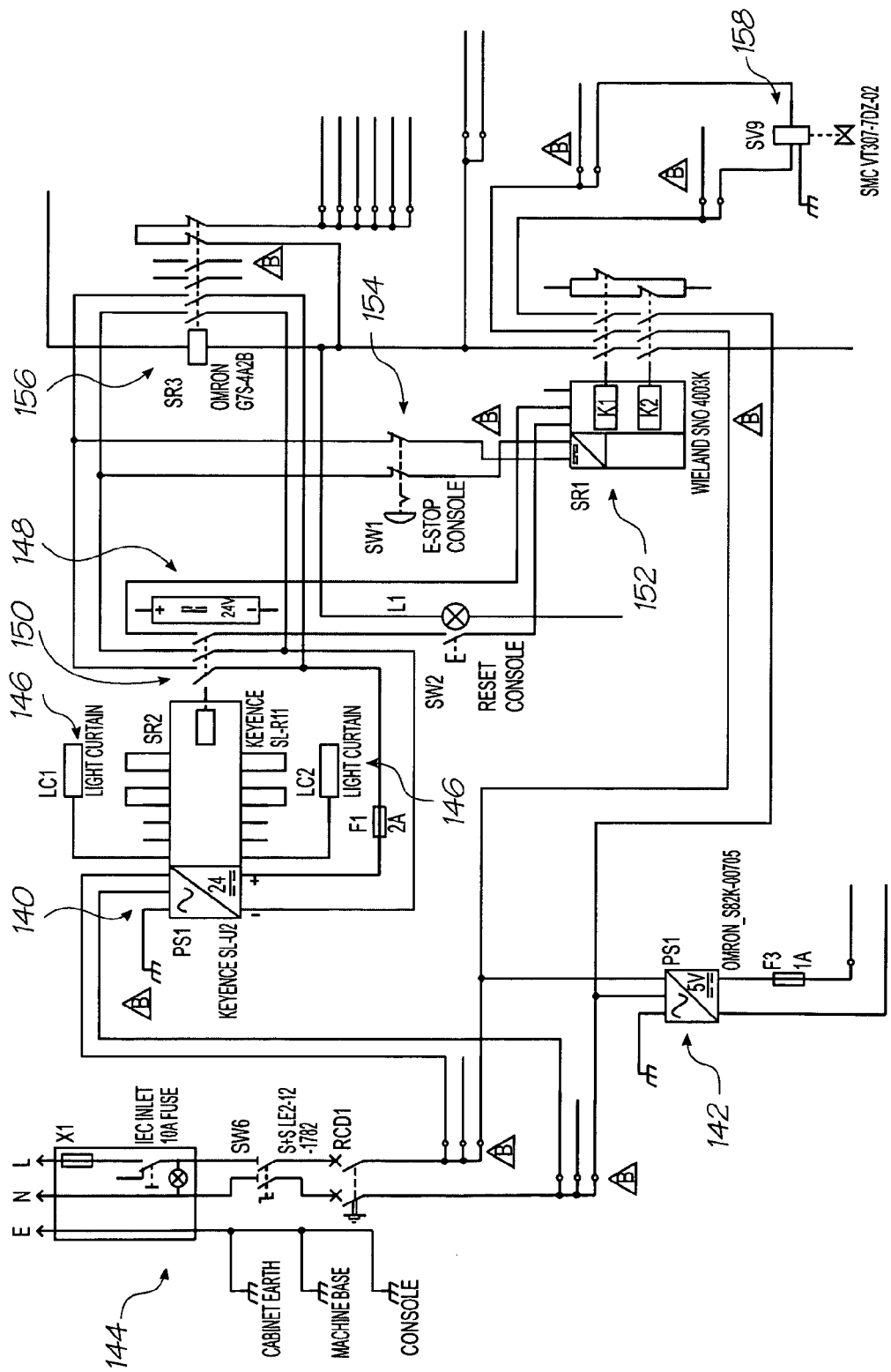
FIG. 10 is a power and safety circuit of the bonding device of FIG. 2.

FIG. 10 shows a circuit diagram of a power and safety arrangement of the bonding device 10. With reference to the previous drawings, unless otherwise indicated, like reference numerals refer to like parts.

Broadly, a 24 Volt power supply is indicated at 140. A 5 Volt power supply is indicated at 142. The power supplies 140, 142 are connected to a fuse arrangement 144.

In this diagram, the light curtain emitter and receiver or light curtain is indicated at 146. The light curtain 146 is connected to a light curtain safety relay 148 that acts to cut the 24 Volt power supply 140 with a switch 150.

A safety mute relay is indicated at 152. The relay 152 is configured to receive a signal from a PLC (described below) to cut off the 24 Volt power supply 142 to the heating arrangement (described below) and to the various pneumatic actuators (also described below).

Figure 11:
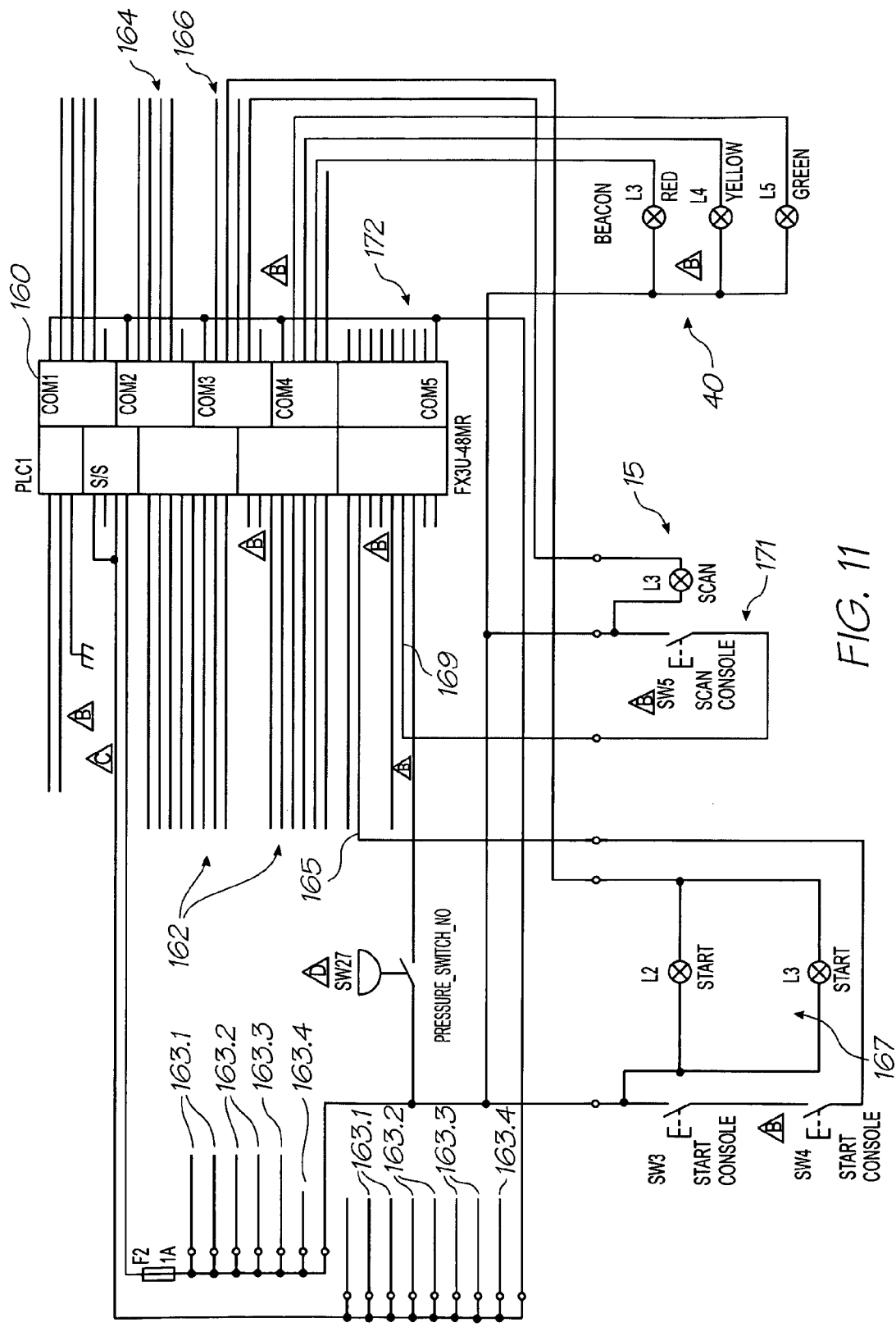
FIG. 11 is a PLC circuit of the bonding device of FIG. 2.

The emergency stop buttons 30c are indicated at 154 in FIG. 11. The buttons 154 are connected to a further safety relay 156. The relay 156 is connected to both the power supplies 140, 142 to cut power when actuated. The relay 156 is also connected to a safety valve 158 for the pneumatic system of the bonding device 10.

FIG. 11 shows a PLC 160 that forms part of the controller 100. The PLC 160 is programmed to control operation of the various components to achieve the method steps described above.

The PLC 160 communicates with solenoid valves (described with reference to FIG. 13) to operate of the vertical platen and clamping assemblies 58, 60, the vertical forming bar assembly 62 and the horizontal heated platen assembly 64 at 162.

At 164, the PLC 160 communicates with solenoid valves to operate the horizontal bar 70, the clamp 66 and the carriage 42.

At 166, the PLC 160 communicates with the mute relay 152, a start lamp 168, a carriage in signal and a scan lamp 170.

At 172, the PLC 160 communicates with the beacon stack 40.

The PLC 160 also communicates with solid state switches (FIGS. 13A and 13B) at 163.1 and with pressure sensors at 163.2 for the necessary feedback control.

The PLC 160 communicates with the optical barcode scanner 15 at 163.3 and with an Ethernet connection at 163.4.

At 165, the PLC 160 communicates with start buttons 167.

At 169, the PLC 160 communicates with a scan console 171 of the scanner 15.

Figure 12:
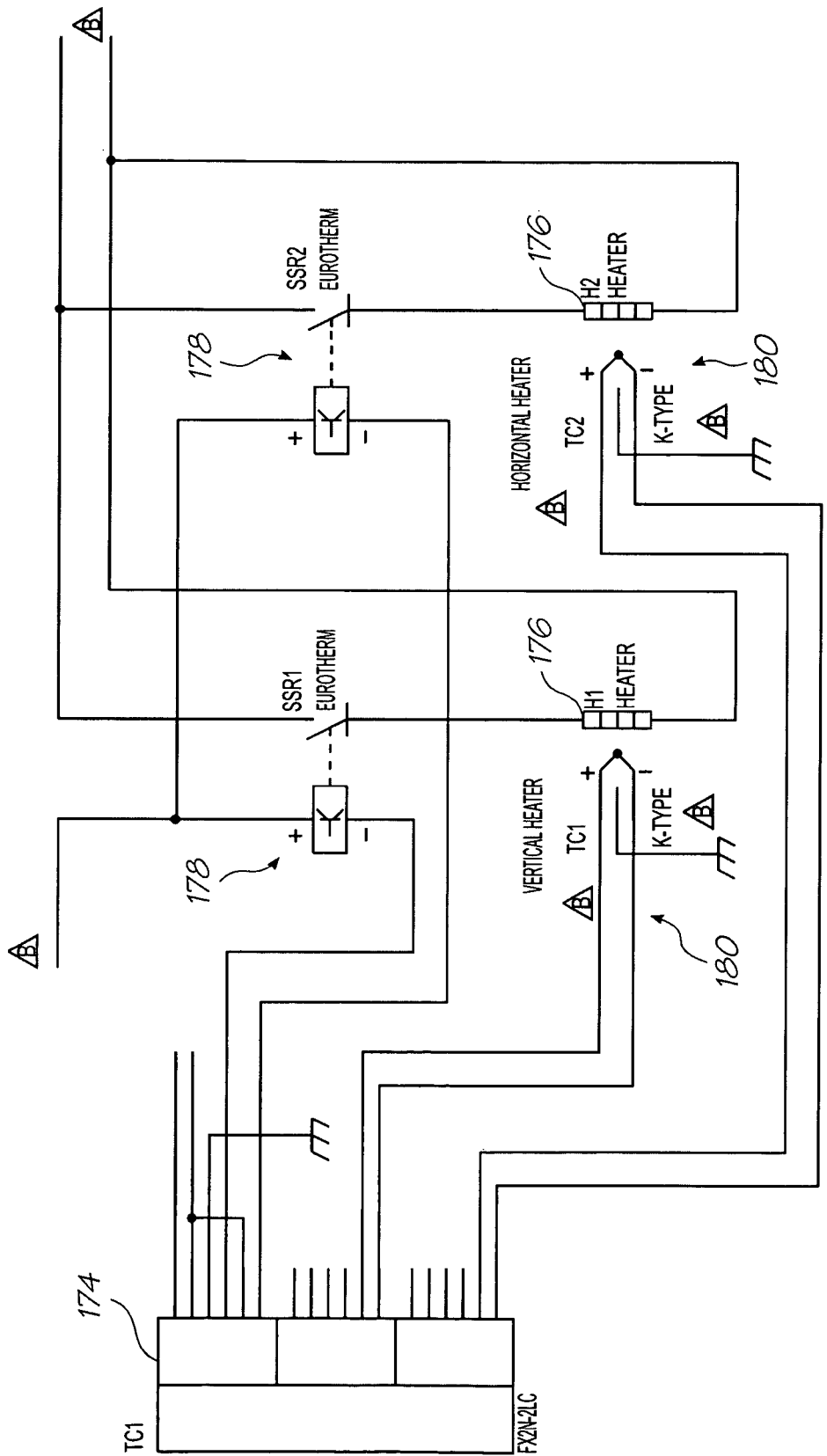
FIG. 12 is a heater circuit of the bonding device of FIG. 2.

FIG. 12 shows a temperature controller 174 that is configured to control the temperature generated by the heater assemblies 74, 86. The replaceable heater cartridges are indicated at 176. Switches 178 for the heater cartridges 176 are connected to the controller 174. Thermocouples 180 are connected to the controller 174 and are positioned to sense the temperature of the cartridges 176.

Figure 13A:
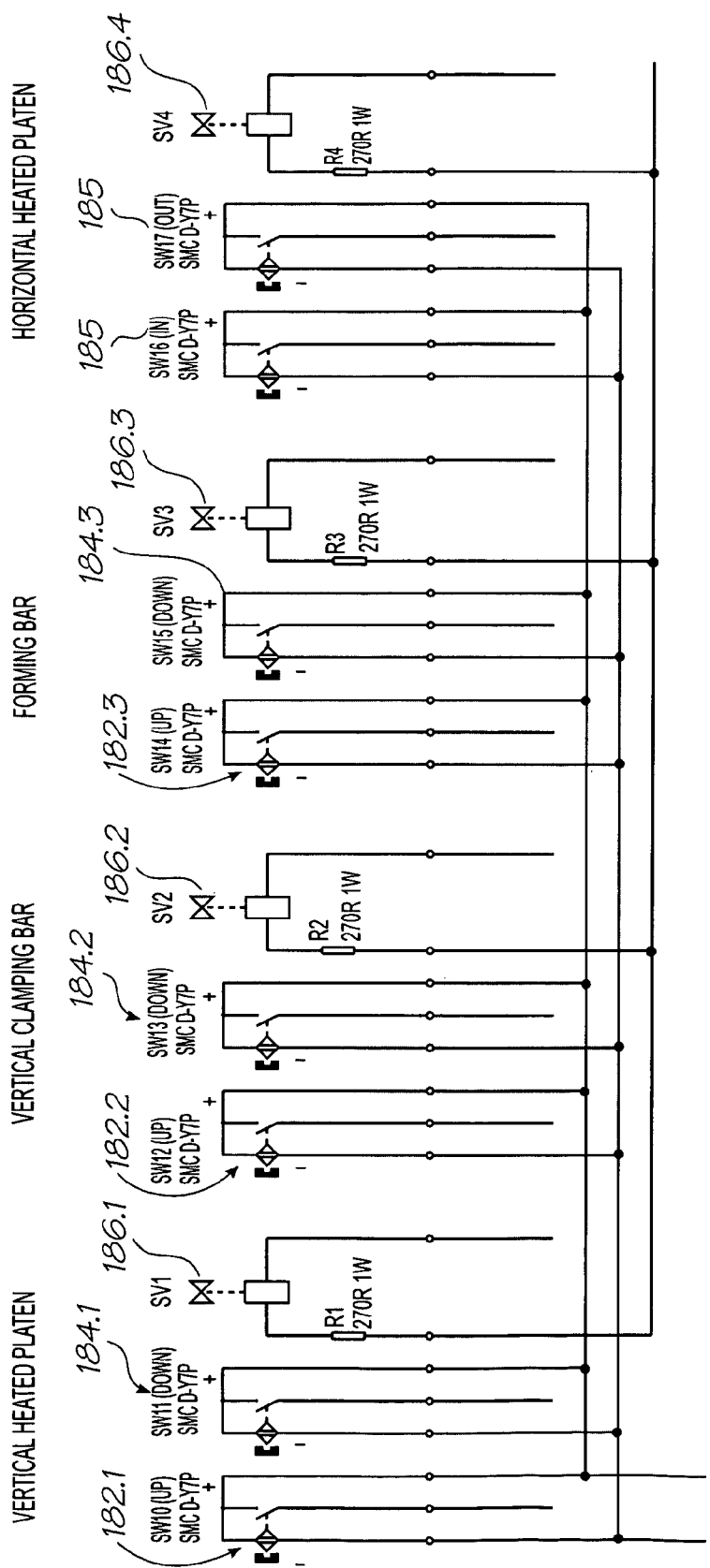
FIGS. 13A-B are an air cylinder actuator circuit of the bonding device of FIG. 2.
Figure 13B:
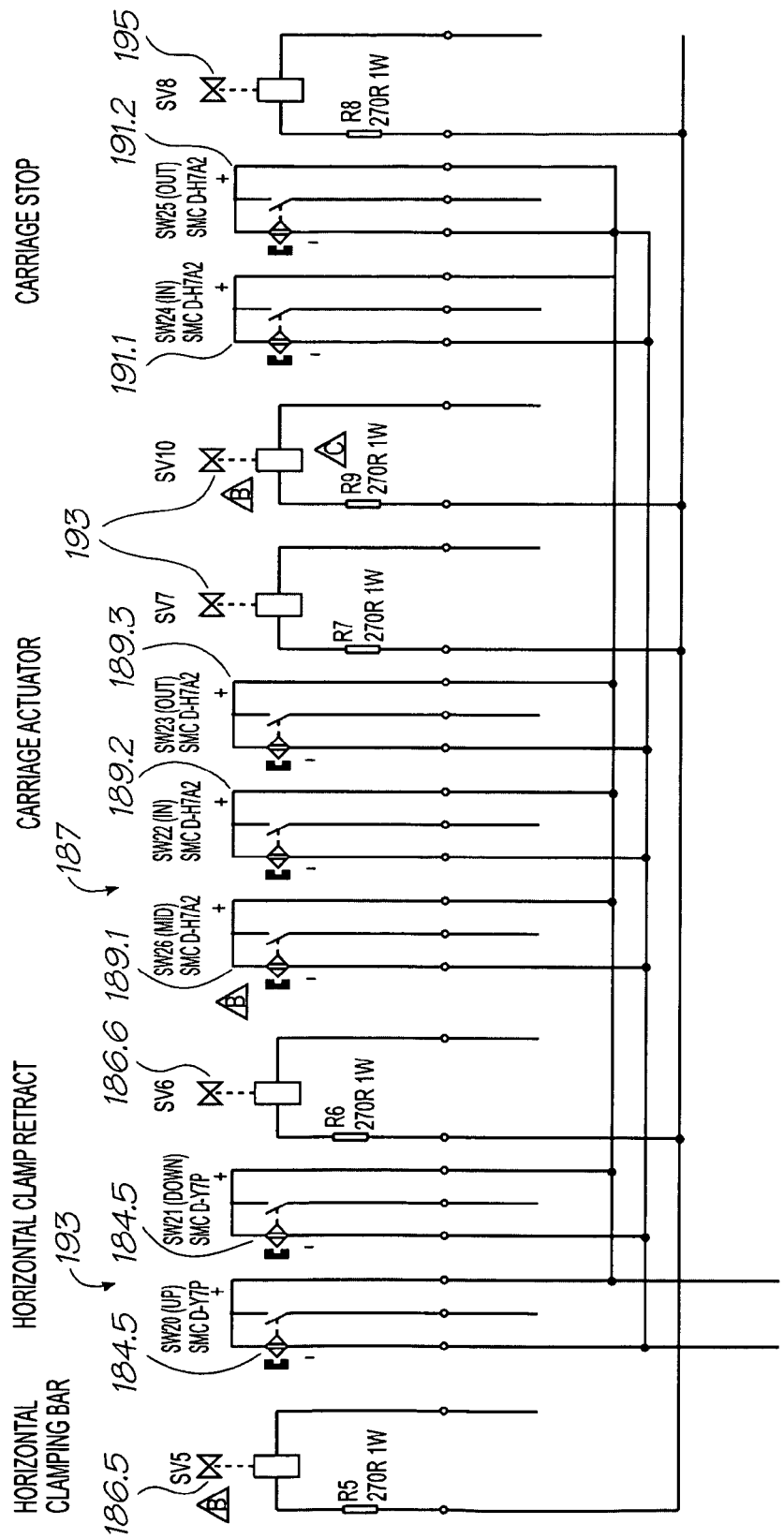

FIGS. 13A and 13B show circuit diagrams of the electrical components associated with the pneumatic system of the bonding device 10.

A circuit for the vertical heated platen assembly 58 includes an "up" solid state limit switch 182.1 and a "down" solid state limit switch. A solenoid valve 186.1 actuates the assembly 58.

A circuit for the vertical clamping assembly 60 includes an "up" solid state limit switch 182.2 and a "down" solid state limit switch 184.2. A solenoid valve 186.2 actuates the assembly 60.

A circuit for the forming bar assembly 62 includes an "up" solid state limit switch 182.3 and a "down" solid state limit switch 184.3. A solenoid valve 186.3 actuates the forming bar assembly 62.

A circuit for the horizontal heated platen assembly 64 includes a pair of limit switches 185. A solenoid valve 186.4 actuates the platen assembly 64.

A circuit for the heater assembly 86 including the brass platen 92 includes a solenoid valve 186.5 to actuate the heater assembly 86.

A circuit for retracting the horizontal heated platen assembly 64 includes a pair of limit switches 184.5. A solenoid valve 186.6 actuates the platen assembly 64.

A circuit for a carriage actuator includes a mid-limit switch 189.1, an "in" limit switch 189.2 and an "out" limit switch 189.3. A pair of solenoid valves 193 provides the necessary actuation.

A circuit for the carriage 42 includes an "in" limit switch 191.1 and an "out" limit switch 191.2. A solenoid valve 195 is provided for displacement of the carriage 42.

As described above, the switches and the solenoid valves are connected to the PLC 160 to facilitate control of the electrical components and thus the pneumatic circuit described below.

Figure 14:
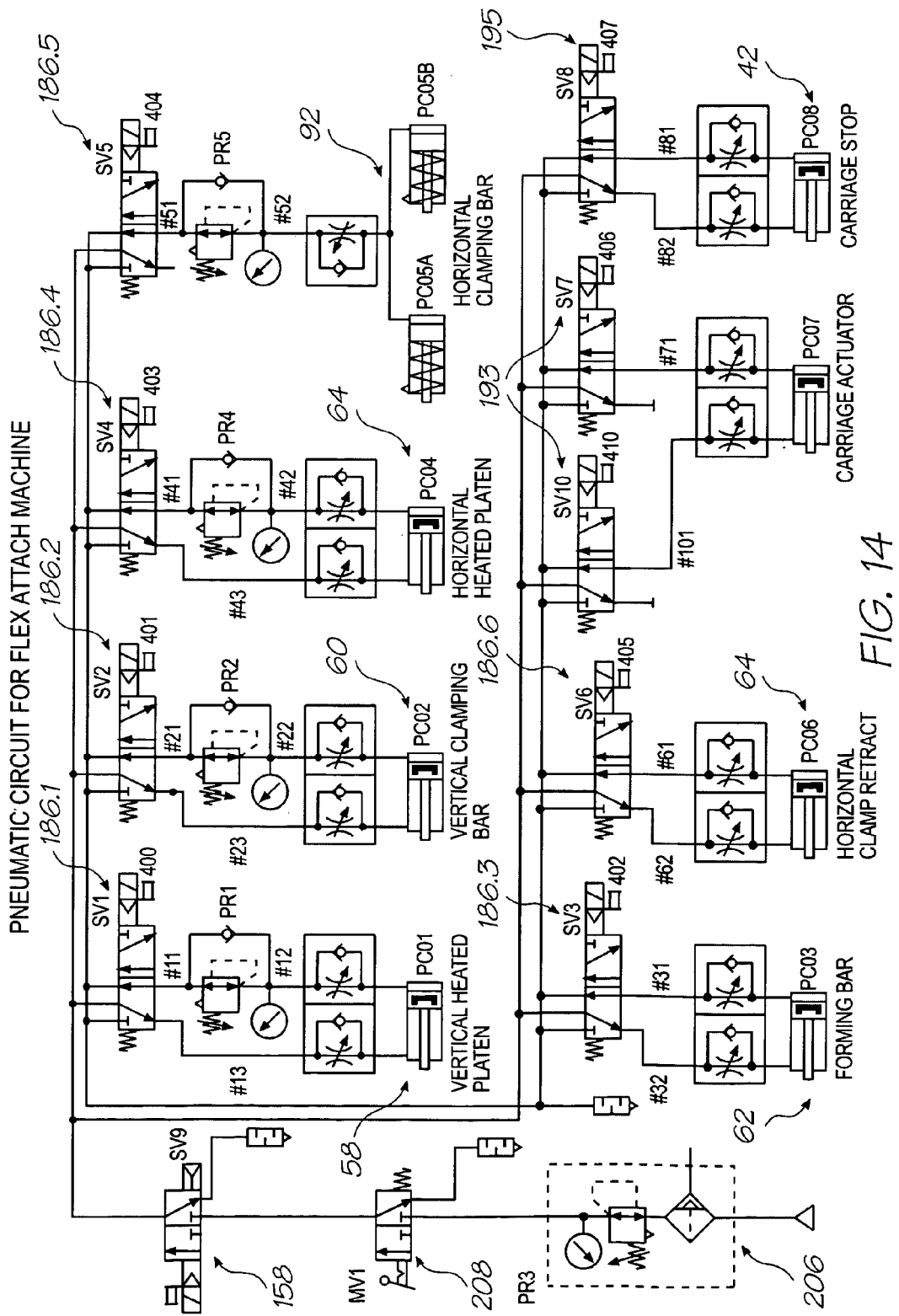
FIG. 14 is a pneumatic circuit of the bonding device of FIG. 2.

FIG. 14 shows the pneumatic circuit or system referred to above. With reference to the previous drawings, like reference numerals refer to like parts, unless otherwise specified.

The circuit receives a pressurized air supply via, in series, a pressure regulator 206, a manual valve 208 and the safety valve 158.

The pressurized air supply is then delivered to via pressure regulators 216 to the various components described above.

A person skilled in the art will appreciate that many embodiments and variations can be made without departing from the ambit of the present invention.

In compliance with the statute, the invention has been described in language more or less specific to structural or methodical features. It is to be understood that the invention is not limited to specific features shown or described since the means herein described comprises preferred forms of putting the invention into effect. The invention is, therefore, claimed in any of its forms or modifications within the proper scope of the appended claims appropriately interpreted by those skilled in the art.

The invention claimed is:

1. A method for connecting a flexible printed circuit board (PCB) to a printhead assembly, the printhead assembly comprising a printhead carrier and an ink ejection printhead carried by the carrier, the method comprising the steps of:

adhering the PCB to a first surface of the printhead;

receiving the printhead and PCB in a mechanical nest, and actuating the nest into a position below a heated platen assembly;

heating the heated platen assembly and actuating the heated platen assembly rectilinearly towards the nest, the heated platen assembly thereby compressing the PCB and the printhead;

actuating a forming bar assembly, provided adjacent the heated platen assembly, rectilinearly towards the nest, the forming bar assembly thereby bending a portion of the PCB extending beyond the printhead towards the printhead assembly; and heating a heater cartridge and actuating the heater cartridge rectilinearly towards the printhead in a direction substantially perpendicular to the direction in which the forming bar assembly is actuated, whereby the PCB is connected to the printhead and bonded to the printhead carrier.

2. A method as claimed in claim 1, wherein the printhead assembly is authenticated by scanning a barcode borne by the printhead assembly, and comparing the scanned barcode with a group of valid barcodes stored in memory to determine a match.

3. A method as claimed in claim 1, wherein the PCB is authenticated by scanning a barcode borne by the PCB, and comparing the scanned barcode with a group of valid barcodes stored in memory to determine a match.

4. A method as claimed in claim 1, wherein the step of connecting the PCB to the printhead involves mechanically connecting the PCB to the printhead with adhesive, and the step of connecting the bent PCB to the printhead carrier involves mechanically connecting the PCB to the printhead carrier with an adhesive.

5. A method as claimed in claim 1, wherein the heated platen assembly and the forming bar assembly are linearly constrained to move along their respective paths.

* * * * *